(12) United States Patent
Yugami et al.

(10) Patent No.: US 7,741,201 B2
(45) Date of Patent: Jun. 22, 2010

(54) SEMICONDUCTOR DEVICE AND METHOD OF MANUFACTURING A GATE STACK

(75) Inventors: Jiro Yugami, Chiyoda-ku (JP); Masao Inoue, Chiyoda-ku (JP); Kenichi Mori, Chiyoda-ku (JP); Shinsuke Sakashita, Chiyoda-ku (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/371,082

(22) Filed: Mar. 9, 2006

(65) Prior Publication Data
US 2006/0214245 A1    Sep. 28, 2006

(30) Foreign Application Priority Data
Mar. 22, 2005    (JP) .............................. 2005-081981

(51) Int. Cl.
*H01L 21/3205* (2006.01)
(52) U.S. Cl. .................... 438/585; 438/197; 438/594; 257/411; 257/412
(58) Field of Classification Search ................. 257/412, 257/411; 438/585, 197, 594
See application file for complete search history.

(56) References Cited

U.S. PATENT DOCUMENTS 6,262,458 B1 *   7/2001   Hu ............................ 257/384
6,294,819 B1 *   9/2001   Sun ........................... 257/410
6,879,001 B2 *   4/2005   Yagishita et al. ............ 257/347
2005/0148127 A1 * 7/2005  Jung et al. .................. 438/197

FOREIGN PATENT DOCUMENTS

JP    2001-203276    7/2001

OTHER PUBLICATIONS

Moon Sig Joo, et al., "Behavior of Effective Work Function in Metal/High-K Gate Stack Under High Temperature Process", Extended Abstracts of the 2004 International Conference on Solid State Devices and Materials, pp. 202-203.
"Process Integration, Devices, and Structures", 2003 Edition of ITRS (International Technology Roadmap for Semiconductors) (http://public.itrs.net/Files/2003ITRS/Home2003.htm), pp. 1-37.
U.S. Appl. No. 11/736,959, filed Apr. 18, 2007, Mori, et al.

* cited by examiner

*Primary Examiner*—Bradley K Smith
*Assistant Examiner*—Mohammad T Karimy
(74) *Attorney, Agent, or Firm*—Oblon, Spivak, McClelland, Maier & Neustadt, L.L.P.

(57) ABSTRACT

The semiconductor device includes a semiconductor substrate, a gate insulating film formed in contact with an upper side of the semiconductor substrate, and a gate electrode formed on the upper side of the gate insulating film and made of metal nitride or metal nitride silicide. A buffer layer for preventing diffusion of nitrogen and silicon is interposed between the gate insulating film and the gate electrode. Preferably, the buffer layer has a thickness of 5 nm or less. In the case where gate electrode contains Ti elements, and the gate insulating film contains Hf elements, the buffer layer preferably contains a titanium film.

7 Claims, 4 Drawing Sheets

SEMICONDUCTOR DEVICE AND METHOD OF MANUFACTURING A GATE STACK

BACKGROUND OF THE INVENTION

1. Field of the Invention

The present invention relates to a semiconductor device and a method of manufacturing the same, and particularly to a semiconductor device which is required to operate with a low voltage as well as a method of manufacturing the same.

2. Description of the Background Art

Transistors selectively attains on and off states, and a current that flows between a source and a drain in the on state, i.e., when a voltage is placed on the gate electrode will now be referred to as an "on current". The magnitude of the on current is proportional to a quantity Q of electric charges induced in a channel region formed at a semiconductor substrate. This charge quantity Q is expressed as follows in connection with an effective film thickness EOT of a gate insulating film.

$$Q \propto Cinv \times (Vg - Vt)$$

where Vg represents a voltage between the gate electrode and the semiconductor substrate, Vt represents a threshold voltage and Cinv is proportional to $(1/(EOT+\Delta T))$. $\Delta T$ is a capacitance occurring between the gate electrode and the semiconductor substrate except for the gate insulating film. Therefore, the above relationship can also be expressed as follows:

$$Q \propto (Vg-Vt)/(EOT+\Delta T)$$

It can be understood that the on current can be increased by increasing charge quantity Q, which can be increased by reducing $(EOT+\Delta T)$. According to the current technology, the EOT is already equal to 2.0 nm or less, and it is expected that an EOT of a High-K gate insulating film of which practical use is being studied will be practically reduced to about 1.0 nm. However, further reduction of the thickness is difficult. Meanwhile, it has been requested to put the metal gate electrode to practical use as a method of reducing $\Delta T$. The "metal gate electrode" is a gate electrode made of metal or metallic compound having electrical conductivity. The metal gate electrode may be simply referred to as a "metal gate". The metal gate electrode does not cause depletion in contrast to the gate electrode made of polycrystalline silicon, and therefore allows reduction of $\Delta T$ to 0.4 nm which is an ultimate value achieved by quantization effect.

For example, "Process Integration, Devices, and Structures", page 12, table 47b in "2003 Edition of ITRS" (International Technology Roadmap for Semiconductors) (http://public.itrs.net/Files/2003ITRS/Home2003.htm) has described a forecast of specifications that will be requested in logic elements from 2010 to 2018. For 45 nm node and later in this table, it is required to put the metal gate electrode to the practical use.

A large obstacle to the practical use of the metal gate electrode is that control of the threshold voltage is difficult. For example, a CMOS (Complementary Metal-Oxide Semiconductor) structure is a combination of n- and p-type transistors, and an n-type MISFET (Metal-Insulator-Semiconductor Field Effect Transistor) requires a gate electrode of a small work function. Also, a p-type MISFET requires a gate electrode of a large work function. In the conventional gate electrodes made of polycrystalline silicon, the work functions of the gate electrodes can be easily adjusted corresponding to the n- and p-type MISFETs by using the ion implantation method, respectively. The polycrystalline silicon heavily doped with, e.g., phosphorus as n-type impurities exhibits the work function of about 4.0 eV. The polycrystalline silicon heavily doped with, e.g., boron as p-type impurities exhibits the work function of about 5.2 eV. By using the n-type polycrystalline silicon and p-type polycrystalline silicon for the n- and p-type MISFETs as described above, respectively, the work functions similar to that of the substrate channel can be easily achieved. In this manner, both the n- and p-types of MISFETs can be configured to have small threshold voltages so that the CMOS structure that can operate with a low voltage can be achieved.

In contrast to the above, the work function of the metal gate electrode takes a value unique to an electrode material, and cannot be adjusted easily in contrast to the polycrystalline silicon. Therefore, it is necessary to provide materials suitable for the electrodes of the n- and p-type MISFETs at respective regions. Thus, two kinds of materials must be arranged at different plane regions on the same chip, respectively. This complicates the process of forming them. The above structure requires, e.g., such steps that a layer of a first material is formed on a gate insulating film, and then a layer of a second material is formed after removing a first metal material from a partial region in the first material layer. This manufacturing method suffers from a problem that deterioration of the gate insulating film cannot be avoided.

For overcoming the above problem, Japanese Patent Laying-Open No. 2001-203276 has proposed a method in which titanium nitride (TiN) is used in a gate electrode, and a work function is changed by changing a concentration or content of nitrogen in the titanium nitride. This method allows employment of the ion implantation method which is similar to that used in the conventional manufacturing method predicted on the gate electrode of polycrystalline silicon, and therefore the implantation dose of nitride in each of regions of the n- and p-type MISFETs can be changed to form the gate electrode having two kinds of work functions in each region.

Meanwhile, the fact that heat treatment causes large changes in work function of the titanium nitride is disclosed by M. S. Joo et al., "Behavior of Effective Work Function in Metal/High-K Gate Stack under High Temperature Process", Extended Abstracts of the 2004 International Conference on Solid State Devices and Materials, p. 202.

SUMMARY OF THE INVENTION

When the titanium nitride already described is used in the process of manufacturing the conventional CMOS structure, such a problem arises that the work function changes during the manufacturing process. In the convention process of manufacturing the CMOS structure, it is necessary to perform impurity implantation by the ion implanting method for forming various kinds of diffusion layers as well as heat treatment at a high temperature for activating the impurities. This heat treatment is usually performed at 1000° C. or more, but the heat treatment causes large changes in work function of the titanium nitride as disclosed in the foregoing reference of M. S. Joo.

Accordingly, an object of the invention is to provide a semiconductor device having a gate electrode stable that can stably maintain a desired work function even when it is subjected to heat treatment, and to provide a method of manufacturing the same.

For achieving the above object, the semiconductor device according to the invention includes a semiconductor substrate, a gate insulating film formed in contact with an upper side of the semiconductor substrate, and a gate electrode made of metal nitride or metal nitride silicide and formed on the upper side of the gate insulating film. A buffer layer preventing diffusion of the nitrogen and silicon is interposed between the gate insulating film and the gate electrode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
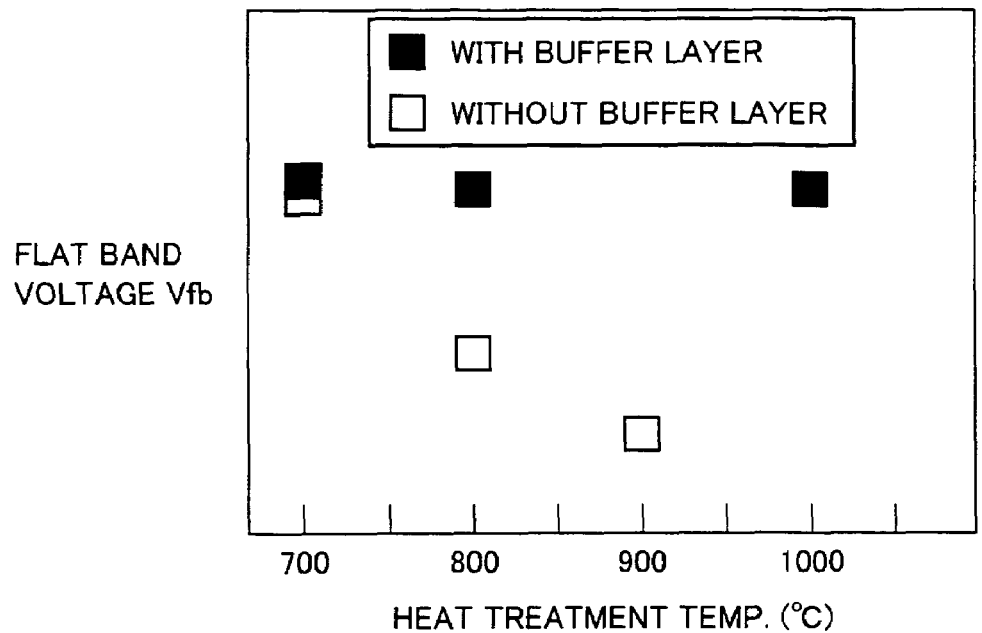
FIG. 1 is a graph of a result of an experiment in a first embodiment according to the invention.

It can be considered that heat treatment changes the work function of the titanium nitride for such reasons that nitride contained in the titanium nitride diffuses during heat treatment, and that silicon diffuses into a gate electrode to form titanium nitride silicide when the gate insulating film is made of a silicon-contained material. This phenomenon has been confirmed in connection with not only the titanium nitride but also materials such as tantalum (Ta) and hafnium (Hf) which cause changes in work function due to presence of the nitrogen or silicon.

Further, a reaction between a material of a gate insulating film and a metal material of a gate electrode may occur to form a new insulating film, and this also deteriorates a heat resistance. For example, when the gate electrode is made of titanium and the gate insulating film is made of hafnium oxide, heat treatment forms a titanium oxide film on an interface. Formation of this new interface insulating film increases an effective film thickness EOT of the gate insulating film, and forms fixed charges in the insulating film, resulting in problems of variations in threshold voltage and deterioration of an interface mobility.

In view of the above, the inventors and others intended to improve the heat resistance by arranging a buffer layer for preventing diffusion of nitrogen and silicon at an interface between the gate electrode and the gate insulating film.

First Embodiment

As a first embodiment according to the invention, the following experiment was performed for inspecting an effect of a buffer layer. Some samples of MISFETs were prepared. In these samples, an n-type silicon substrate was provided at its surface with a gate electrode made of TaSiN and a gate insulating film made of HfSiON. In some of the prepared samples, a buffer layer made of SiN and having a physical film thickness of 2 nm was interposed between the gate electrode and the gate insulating film. The other samples were not provided with a buffer layer. The samples with the buffer layer correspond to the semiconductor device according to the invention.

As exemplified herein, the semiconductor device according to the invention includes a semiconductor substrate, a gate insulating film formed in contact with an upper side of the semiconductor substrate, and a gate electrode made of metal nitride or metal nitride silicide and formed on the upper side of the gate insulating film. A buffer layer preventing diffusion of the nitrogen and silicon is interposed between the gate insulating film and the gate electrode. Preferably, the buffer layer includes a metal film, a metal nitride film or a metal silicide film. Preferably, the gate insulating film contains Si elements or N elements. Preferably, the gate insulating film contains elements of Hf, Al, La, Zr or Ti as well as O elements, N elements and Si elements.

Heat treatment was effected on each sample, and a flat band voltage was measured before and after the heat treatment. The heat treatment after formation of the gate electrode was performed in a nitrogen atmosphere achieving an oxygen concentration of 5 ppm or lower for preventing oxidation of a surface of the gate electrode. "Pure nitrogen" in the following description indicates the nitrogen atmosphere achieving the above condition. Since the flat band voltage corresponds to a difference in work function between the substrate and the gate electrode, it can be easily determined by measuring the flat band voltage whether the change in work function of the gate electrode occurred or not.

FIG. 1 is a graph illustrating a result of the experiment. It can be read from this graph that the flat band voltage changes when the heat treatment at 700° C. or more was effected on the sample without a buffer. The change in flat band voltage did not occur in the sample with the buffer layer even when the heat treatment was performed at 1000° C. It can be understood from these results that the buffer layer is effective at improving the heat resistance. It can be considered that this effect results because it is possible to prevent changes in content of the nitrogen and silicon in the gate electrode due to mutual diffusion of the nitrogen and silicon.

Second Embodiment

Figure 2:
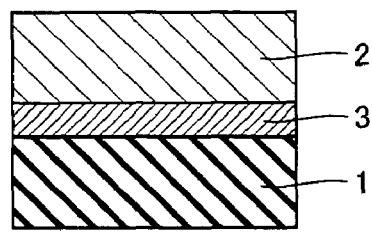
FIG. 2 is a sectional view showing, on an enlarged scale, a portion of a semiconductor device before heat treatment in a second embodiment according of the invention.

As a semiconductor device of a second embodiment according to the invention, a MISFET shown in FIG. 2 was prepared. This MISFET includes a gate insulating film 1 made of HfO$_2$, a gate electrode 2 made of TiN and a buffer layer 3 which is made of a titanium film of 1 nm in thickness and is interposed between the gate insulating film and the gate electrode. Thus, in the semiconductor device of the second embodiment, gate electrode 2 contains Ti elements, gate insulating film 1 contains Hf elements and buffer layer 3 contains the titanium film.

Figure 3:
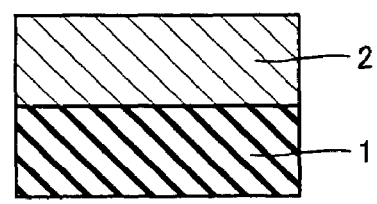
FIG. 3 is a sectional view for comparison in the second embodiment and shows, on an enlarged scale, a portion of a semiconductor device without a buffer layer before heat treatment.

For comparison, a MISFET shown in FIG. 3 was prepared. This MISFET has the same structure as that shown in FIG. 2 except for that buffer layer 3 is not employed. Each of FIGS. 2 and 3 shows an interface between the gate insulating film and the gate electrode in the MISFET as well as a portion near it.

Figure 4:
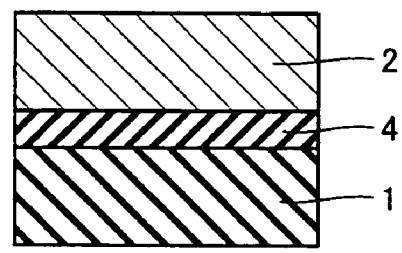
FIG. 4 is a sectional view for comparison in the second embodiment, and shows, on an enlarged scale, a portion of the semiconductor device without a buffer layer after heat treatment.

In the MISFET without a buffer layer, it was confirmed that a TiO$_2$ film 4 was formed between gate insulating film 1 and gate electrode 2 as shown in FIG. 4 after heat treatment was performed in pure nitride at 800° C. for 30 seconds. CV characteristics of the MISFET without a buffer were measured before and after the heat treatment assuming that the MISFET was a capacitor. A table 1 represents a deviation of a voltage axis, i.e., hysteresis obtained thereby. As represented in table 1, it was determined that the heat treatment significantly increased the hysteresis torque. It can be considered that this significant increase was caused because TiO$_2$ film 4 formed at the interface acted as a charge trap layer.

TABLE 1

| | (all values in mV) | |
|---|---|---|
| | Without Buffer Layer | With Buffer Layer |
| Before Heat Treatment | 10 | 11 |
| After Heat Treatment | 50 | 9 |

Figure 5:
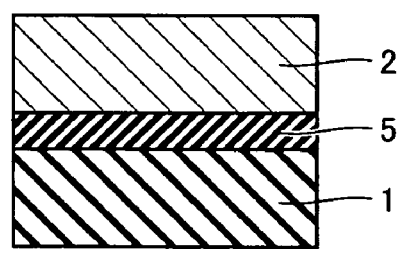
FIG. 5 is a sectional view showing, on an enlarged scale, a portion of the semiconductor device after heat treatment in the second embodiment according to the invention.

In contrast to the above, it was determined from the semiconductor device of the embodiment, i.e., the MISFET with buffer layer 3 shown in FIG. 2 that the increase in hysteresis did not occur even after the heat treatment under the same conditions. It was confirmed from inspection that an insulating film 5 having a structure of $HfTiO_4$ was formed at the interface between gate insulating film 1 and gate electrode 2 as shown in FIG. 5, and a $TiO_2$ film was not present. The structure of $HfTiO_4$ is stable with respect to the heat treatment, and has a relative dielectric constant of 50. Thus, it has a high relative dielectric constant. Therefore, the semiconductor device of this embodiment can offer an effect that the hysteresis does not increase, and the effective thickness EOT of the gate insulating film does not increase.

In both the first and second embodiments, the buffer layer has the thickness of 5 nm or less, and it is preferable that the buffer layer has the thickness of 5 nm or less. When the buffer layer has the thickness of 5 nm or less, the work function of the gate electrode does not depend on the buffer layer, and is substantially determined by the work function of the gate electrode itself.

Third Embodiment

A MISFET was prepared as a semiconductor device of a third embodiment according to the invention. This MISFET includes a gate insulating film made of HfSiON and a gate electrode made of TiN. An SiN film is interposed as a buffer layer between the gate insulating film and the gate electrode.

Figure 6:
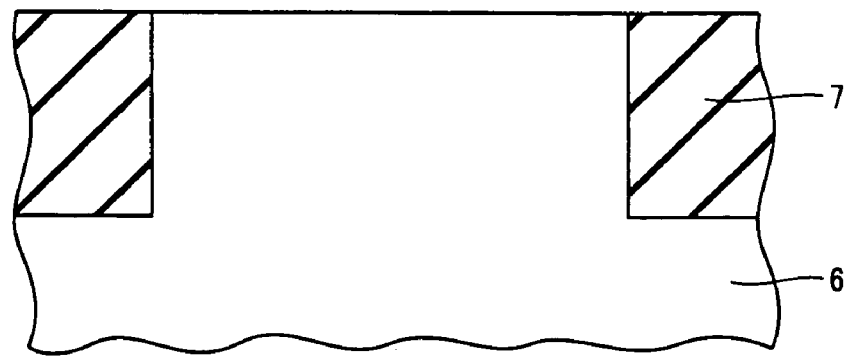
FIGS. 6 to 10 illustrate first to fifth steps of a manufacturing method of a semiconductor device in a third embodiment according to the invention, respectively.
Figure 7:
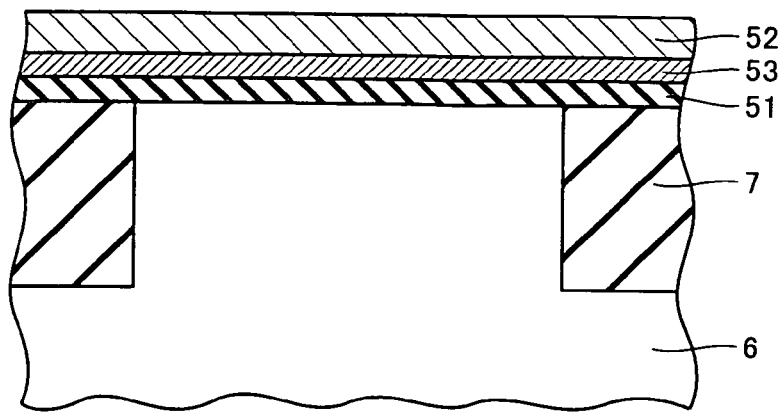

An example of a method of manufacturing a semiconductor device according to the embodiment will now be described. First, as shown in FIG. 6, an element isolation region 7 of a STI (Shallow Trench Isolation) type is formed by a usual technique at a surface of a semiconductor substrate 6. As shown in FIG. 7, an HfSiON layer 51 for forming gate insulating film 1, an SiN film 53 for forming buffer layer 3 and TiN layer 52 for forming gate electrode 2 are successively deposited to form a layered structure. TiN layer 52 for forming the gate electrode contains nitrogen of which content is controlled in advance for adjusting the work function. The nitrogen content of TiN layer 52 is determined to provide the work function of 5.0 eV before the heat treatment.

Figure 8:
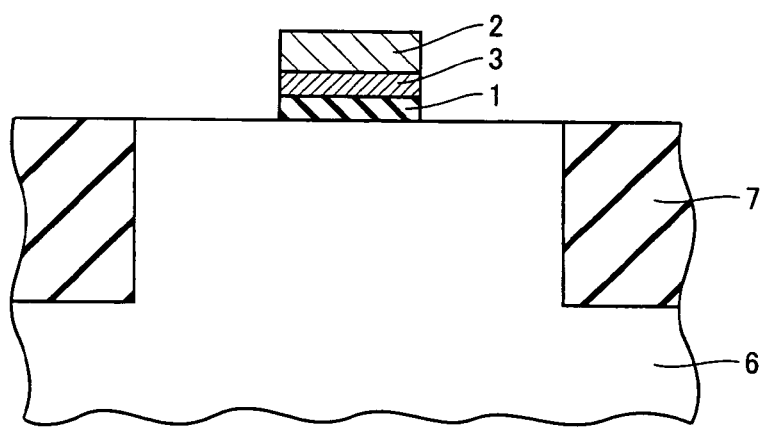
Figure 9:
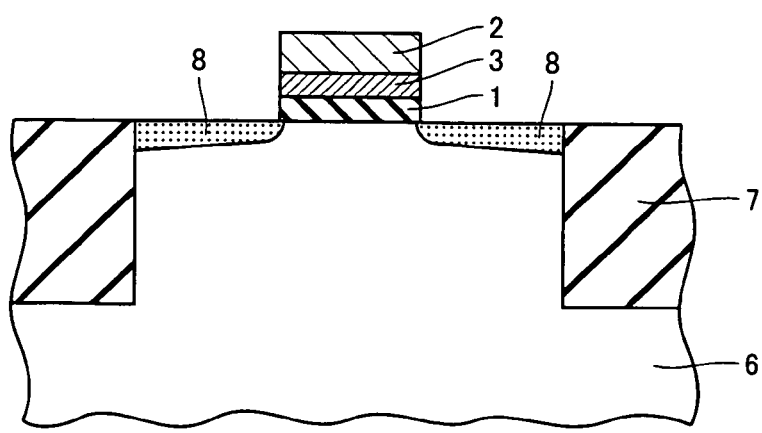
Figure 10:
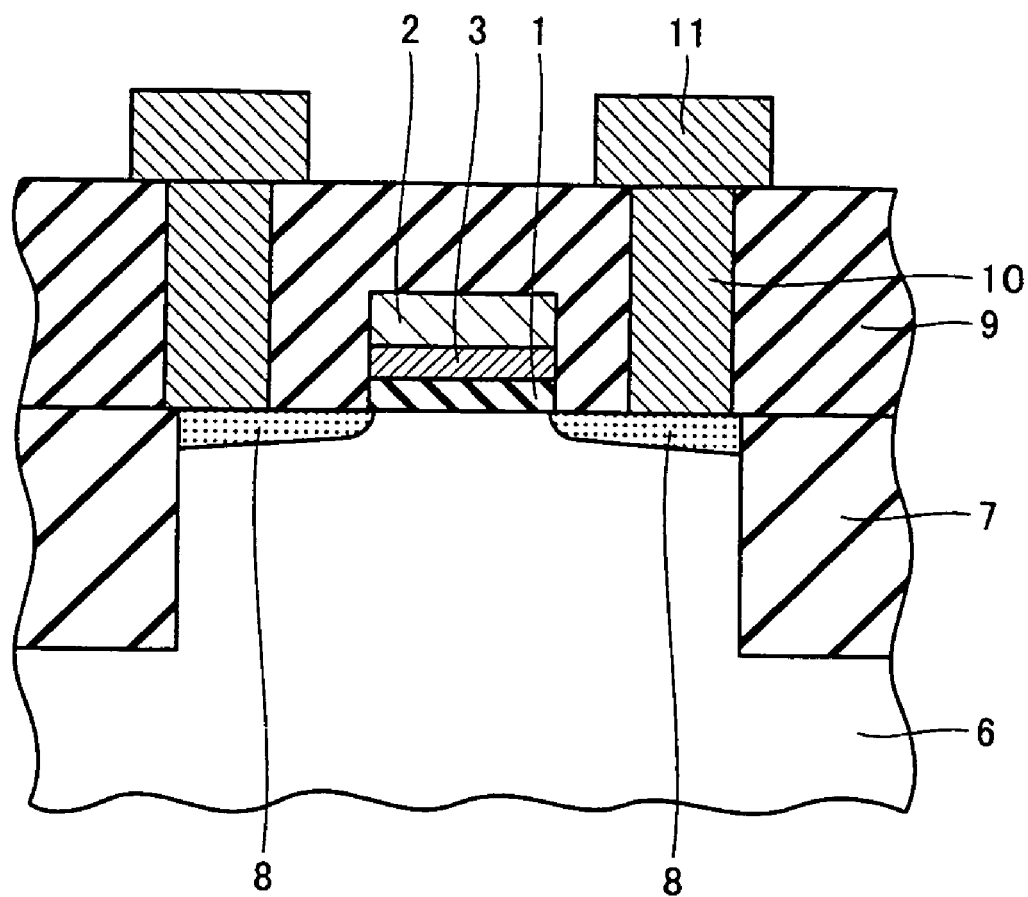

Processing is performed by usual lithography and dry etching to obtain a structure shown in FIG. 8. The structure thus obtained is a layered structure including gate insulating film 1, buffer layer 3 and gate electrode 2 which are layered in this order on the surface of semiconductor substrate 6. Then, the ion implantation method is implemented to form a diffusion layer 8 for forming a source region and a drain region at the surface of semiconductor substrate 6 and particularly at the vicinity of the layered structure as shown in FIG. 9. Thereafter, heat treatment for activation is performed at 1000° C. for 5 seconds. Further, an interlayer insulating film 9, a contact portion 10 and a conductive layer 11 for forming interconnections are formed as shown in FIG. 10. In this manner, the MISFET according to the embodiment is formed.

The impurity concentration distributions in the channel region and diffusion layer 8 are adjusted such that the MISFET has the threshold voltage of −0.3 V when the work function of the gate electrode is 5.0 eV.

Transistor characteristics of the p-type MISFET obtained in the above manufacturing method were measured, and the measured threshold voltage was equal to −0.33 V. This is close to an intended value of −0.3 V so that it can be considered the designed structure and characteristics are substantially achieved. From this, it is found that the invention does not cause the change in work function, and allows easy adjustment of the threshold voltage even when the structure is subjected to the heat treatment similar to that in the conventional manufacturing process for the CMOS structure.

Although it is stated that the activation is performed at 1000° C., the activation can be performed sufficiently, and the buffer layer can suppress the change in work function even when the heat treatment is performed at a temperature or 1000° C. or more. Therefore, it is preferable that the heat treatment is performed at the temperature of 1000° C. or more.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:
   forming a gate structure on a surface of a semiconductor substrate, the gate structure including
   a gate insulation film having hafnium elements and oxygen elements,
   a gate electrode having a titanium nitride film, and
   a layer being provided between the gate insulation film and the gate electrode, and having a titanium film not including nitrogen elements, oxygen elements and silicon elements;
   forming a source region and a drain region in the surface of the semiconductor substrate, the gate structure located above a region between the source and drain; and
   performing a heat treatment on the semiconductor substrate after forming the gate structure.

2. The method of manufacturing the semiconductor device according to claim 1, wherein the gate structure includes an insulation film being in direct contact with the gate electrode after performing the heat treatment, the insulation film having hafnium elements, titanium elements and the oxygen elements.

3. The method of manufacturing the semiconductor device according to claim 1, wherein the titanium film having a first surface being in direct contact with the titanium nitride film and a second surface being in direct contact with the gate insulation film.

4. The method of manufacturing the semiconductor device according to claim 1, wherein the gate insulation film does not include titanium elements.

5. The method of manufacturing the semiconductor device according to claim 4, wherein the gate insulation film does not include nitrogen elements.

6. The method of manufacturing the semiconductor device according to claim 5, wherein the gate insulation film does not include silicon elements.

7. The method of manufacturing the semiconductor device according to claim 1, wherein the layer has a thickness of 5 nm or less.

* * * * *